United States Patent [19]

Wilson

[11] Patent Number: 5,030,113
[45] Date of Patent: Jul. 9, 1991

[54] ONE-PIECE INSULATOR BODY AND FLEXIBLE CIRCUIT

[75] Inventor: Albert H. Wilson, Los Angeles, Calif.

[73] Assignee: ITT Corporation, Secaucus, N.J.

[21] Appl. No.: 608,851

[22] Filed: Nov. 5, 1990

[51] Int. Cl.[5] .............................................. H01R 9/09
[52] U.S. Cl. ...................................... 439/80; 439/931
[58] Field of Search .................... 439/79, 80, 78, 59, 439/60, 61, 62, 74, 630, 631, 931, 67, 77

[56] References Cited

U.S. PATENT DOCUMENTS

| | | | |
|---|---|---|---|
| 3,353,069 | 11/1967 | Slavin | 317/101 |
| 3,401,369 | 9/1968 | Palmateer . | |
| 3,638,166 | 1/1972 | Steipe . | |
| 3,663,925 | 5/1972 | Proctor | 439/80 X |
| 3,727,168 | 4/1973 | Henschen et al. . | |
| 4,095,866 | 6/1978 | Merrill . | |
| 4,143,932 | 3/1979 | Boutros . | |
| 4,298,237 | 11/1981 | Griffith et al. . | |
| 4,489,999 | 12/1984 | Miniet . | |
| 4,621,305 | 11/1986 | Daum | 361/398 |
| 4,668,033 | 5/1987 | Reichardt | 439/79 |
| 4,689,721 | 8/1987 | Damerow et al. | 361/388 |
| 4,755,147 | 7/1988 | Young | 439/77 |
| 4,781,601 | 11/1988 | Kuhl et al. | 439/77 |
| 4,793,816 | 12/1988 | Pittman et al. | 439/79 |
| 4,811,165 | 3/1989 | Currier et al. | 361/386 |
| 4,881,908 | 11/1989 | Perry et al. | 439/161 |

OTHER PUBLICATIONS

Invisible Interconnection, "Connection Technology", Aug. 1989, pp. 35–40, by S. S. Simpson, Rogers Corp., Rogers, Conn., U.S.A.

3-D Circuits–Have They Arrived?, "Electronic Packaging and Production", by K. Gilleo, Ph.D., Sheldahl Inc., Northfield, Minn., U.S.A.

3-D Molded Circuit Use Grows, "Electronic Packaging and Production", p. 18, by S. L. Spitz, Newark, Del. Packaging Ideas, "Electronic Packaging and Production:", pp. 47–48; Oct. 1989.

Primary Examiner—Neil Abrams
Assistant Examiner—Khiem Nguyen
Attorney, Agent, or Firm—Thomas L. Peterson

[57] ABSTRACT

A circuit apparatus connector is described, of the type which includes a body holding rows of contacts (92, FIG. 2) and a flexible circuit for connecting the contacts to terminal pads (144, 146) on a circuit board device (140), to allow the circuit board device to be shifted slightly relative to the contacts. An insulator (84) is provided which includes a body (86) with holes for holding the contacts and with an integral elongated arm (100) whose end can bear against a side of the circuit board device. Conducting plating regions are formed on the insulator, each region plating the walls of a contact-receiving hole (90) and forming a trace (120) on one side of the arm that ends in a contact pad (122) that engages a terminal pad on the circuit board device.

14 Claims, 5 Drawing Sheets

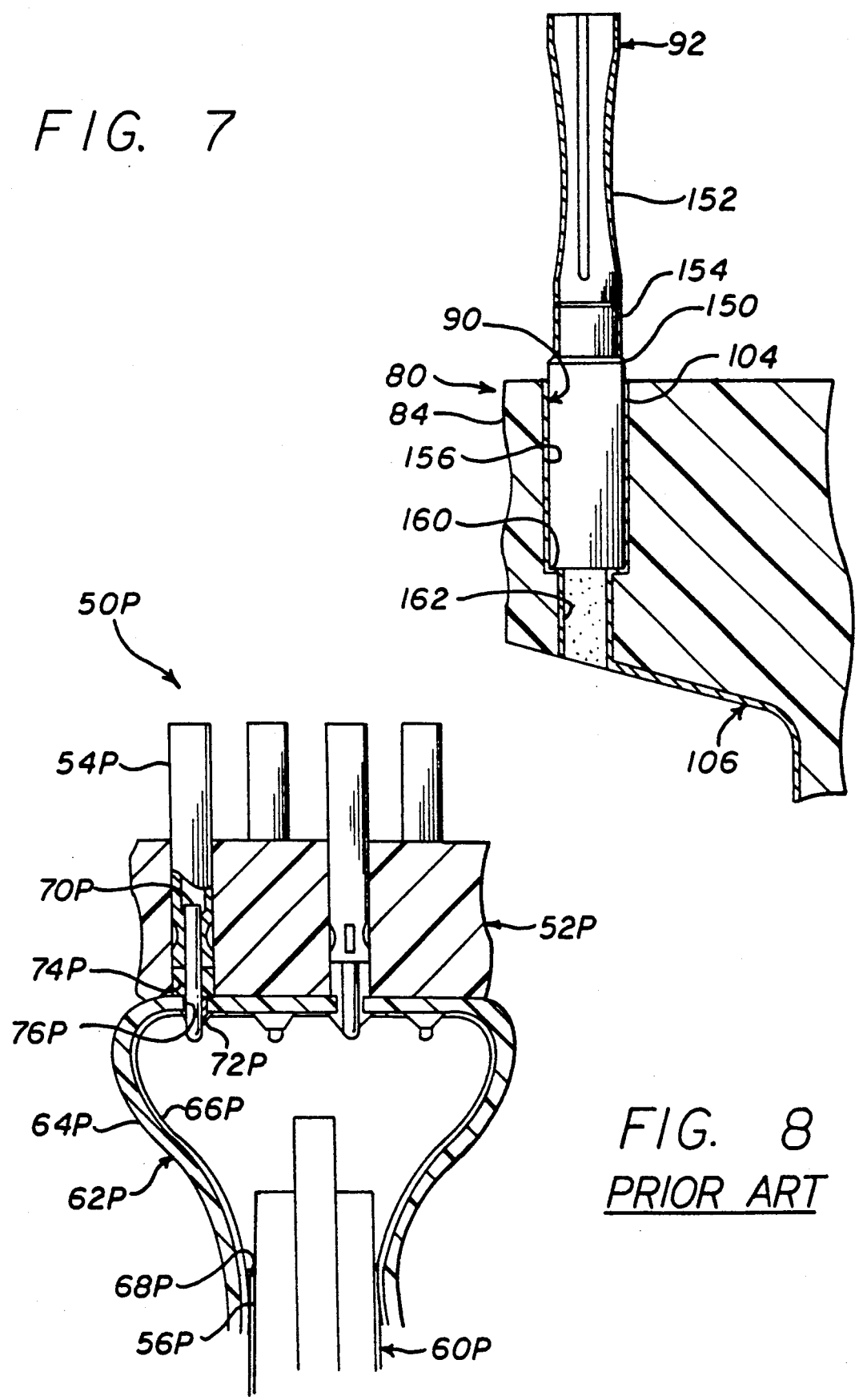

ONE-PIECE INSULATOR BODY AND FLEXIBLE CIRCUIT

BACKGROUND OF THE INVENTION

In some applications, connector bodies that hold multiple contacts must be "free floating" to allow the contacts and body to shift sidewardly. One application requiring such shifting is in a system wherein a circuit module is inserted into a rack until a circuit board connector on the module mates with a connector on the rack. Then a heat sink plate and circuit boards of the module are shifted slightly to clamp the heat sink plate against a cold plate. During such clamping and consequent sideward shifting of the plate, the connector contacts do not shift and therefore must be "free floating" with respect to the circuit boards and heat sink plate. One prior art approach is to use a block-shaped connector body for holding the contacts, and to use a flexible circuit board or flexboard with conductive traces that each have one end soldered to a contact lying in the block and an opposite end engaged with a terminal on a circuit board. An arrangement of this type that could allow sideward shifting of a circuit board device, is shown in U.S. Pat. No. 3,401,369.

While the use of a block and flexboard enables the required amount of shifting for "free floating", it has disadvantages. The need to assemble the flexboard to the contact-holding body so as to assure electrical connection between each contact and a trace on the flexboard, requires considerable labor, increases the possibility of defects, and limits the density of contacts. A connector which could connect multiple contacts to a circuit board device in a manner to allow slight shifting of the contacts with respect to the circuit board device, which used a minimum of labor and allowed for high density placement of contacts, would be of considerable value.

SUMMARY OF THE INVENTION

In accordance with one embodiment of the present invention, a connector assembly is provided which can hold multiple contacts and connect them to a circuit board or other circuit device in an assembly that allows the contacts to shift position relative to the circuit device. The connector assembly includes an insulator of dielectric material having a body with through holes for receiving contacts and having an elongated flexible arm extending from the body. Electrically conductive plating regions are formed on the insulator, with each region plating the walls of each contact-receiving hole and also forming a trace extending from each hole and along the arm. Each trace forms a contact pad at the inner portion of the arm, which lies furthest from the body. The body and arm are integrally molded, but the arm is elongated and less than half the width of the body, to allow the arm to flex to press its contact pads against pads of a circuit device.

A connector assembly can include two insulators, each having a body and an arm, with the inner ends of the two arms spaced apart by slightly less than the thickness of the circuit board device. The connector can include at least four rows of contacts, with each insulator having two rows of contacts lying on opposite sides of the arm. Traces lie on opposite sides of the arm and extend to contact pads near the inner arm end. The traces on a first side of the arm extend around the extreme inner end of the arm, to contact pads on the second side of the arm. Each contact is installed in the body and electrically connected to a corresponding trace by reflow soldering the contact to the walls of the body hole.

The novel features of the invention are set forth with particularity in the appended claims. The invention will be best understood from the following description when read in conjunction with the accompanying drawings.

BRIEF DESCRIPTION OF THE DRAWINGS

FIG. 7 is a view taken on the line 7—7 of FIG. 4, showing only a portion thereof.

FIG. 8 is a partial sectional side view of a connector assembly of the prior art.

DESCRIPTION OF THE PREFERRED EMBODIMENTS

Figure 1:
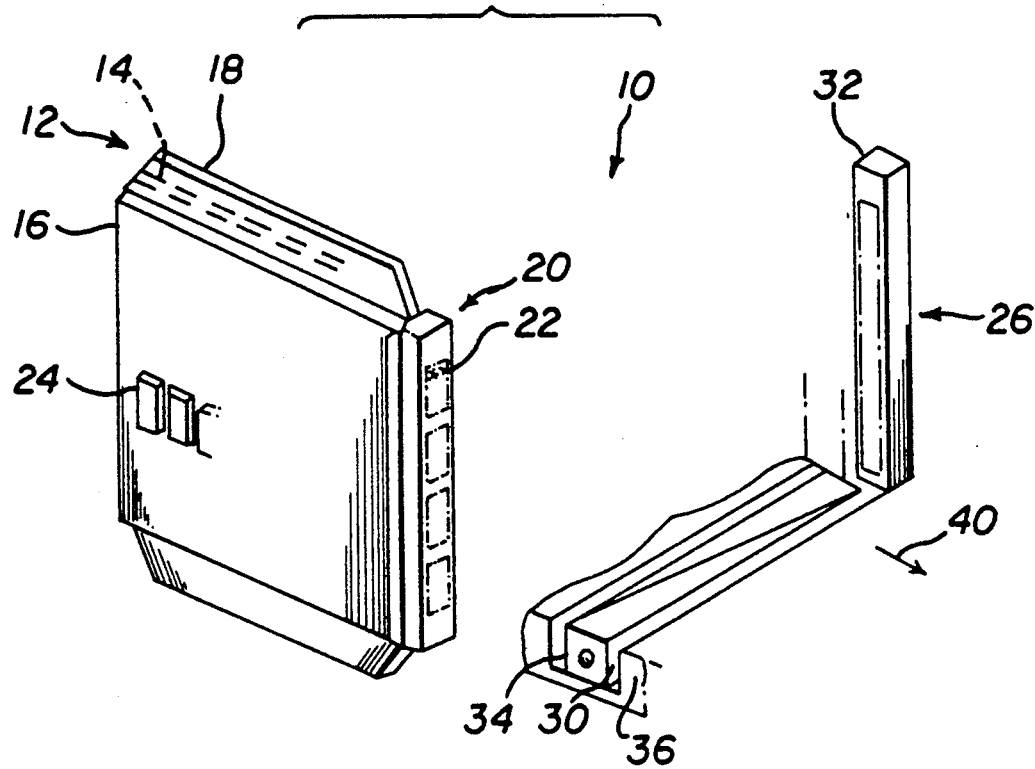
FIG. 1 is an exploded isometric view of a circuit assembly which includes a module having a connector assembly of the present invention, and a rack which can receive the module.

FIG. 1 illustrates a circuit apparatus 10 which includes a plug-in module 12 that has a pair of circuit boards 14, 16 on opposite sides of a heat sink plate 18. A connector assembly 20 on the outer or leading edge of the module has multiple contacts 22 that are electrically connected to components 24 on the circuit boards. The module is designed to be inserted into a rack 26 by sliding projecting portions of the module heat sink plate into tracks such as 30 until the module connector assembly 20 mates with a rack connector assembly 32. After such mating, upper and lower clamps such as clamp 34 are operated to clamp each end of the heat sink tightly against a cold plate 36. During such clamping, the plate 18 and circuit boards move laterally in the direction of arrow 40, by a distance such as 0.010 inch. With the connector assemblies 20, 32 mated, the assembly 20 cannot move in the direction 40. Accordingly it is necessary for the connector assembly 20 to be "free floating", that is, able to move laterally relative to the rest of the module, while still remaining in reliable electrical connection with conductors of the circuit boards.

FIG. 8 shows one currently used connector assembly design 50P, which includes a body 52P of dielectric material with multiple holes holding socket contacts 54P. Each socket contact is connected to a corresponding terminal pad 56P on a circuit board device 60P, through a flex circuit 62P. The flex circuit includes a thin highly flexible circuit board 64P and conductive traces such as 66P on the board. The traces lead to contact pads 68P that engage circuit board terminal pads 56P. Each socket contact 54P includes a pin 70P which projects through a hole in the flex board and which is soldered at 72P to the trace portion that surrounds the hole in the board. The socket contact is held in place in the body by a quantity of potting material 74P lying in the body hole. Considerable labor was required to assemble the body 52P and flex circuit board 64P, and insert the contact pins 70P through the multiple holes of the flex board and solder them in place. This resulted in increased cost and increased possibility of defects, especially where the width of each trace is small (e.g. 0.020 inch). Also, each trace 66P had to be enlarged around each hole 76P in the flex board, which required greater spacing of the contacts.

Figure 2:
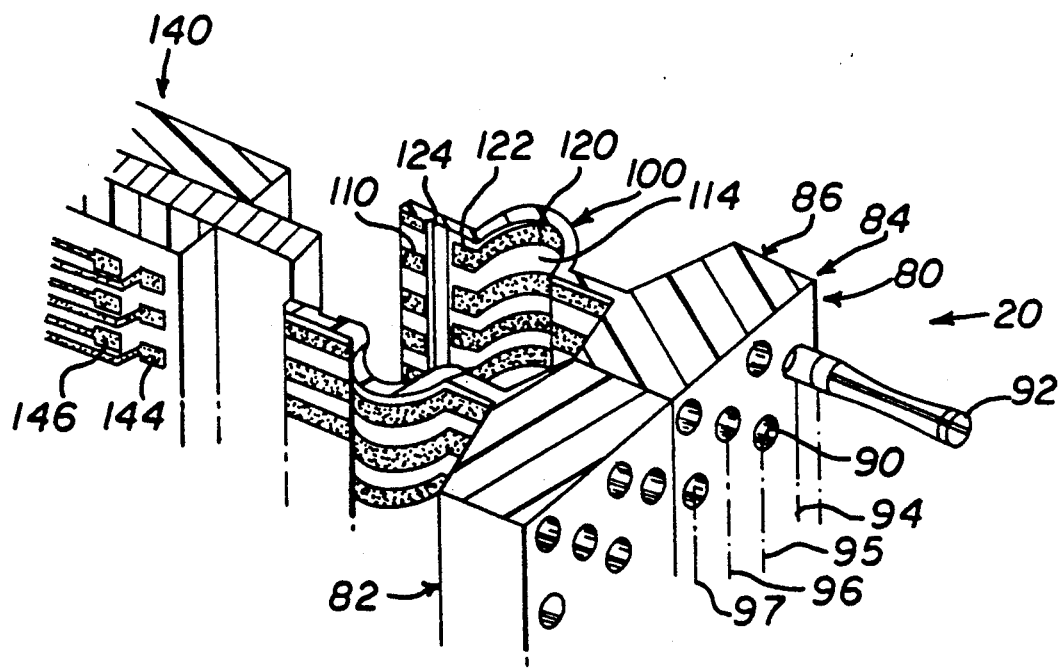
FIG. 2 is a partial isometric and exploded view of the circuit assembly of FIG. 1, showing the circuit board device and the connector assembly of the present invention.
Figure 3:
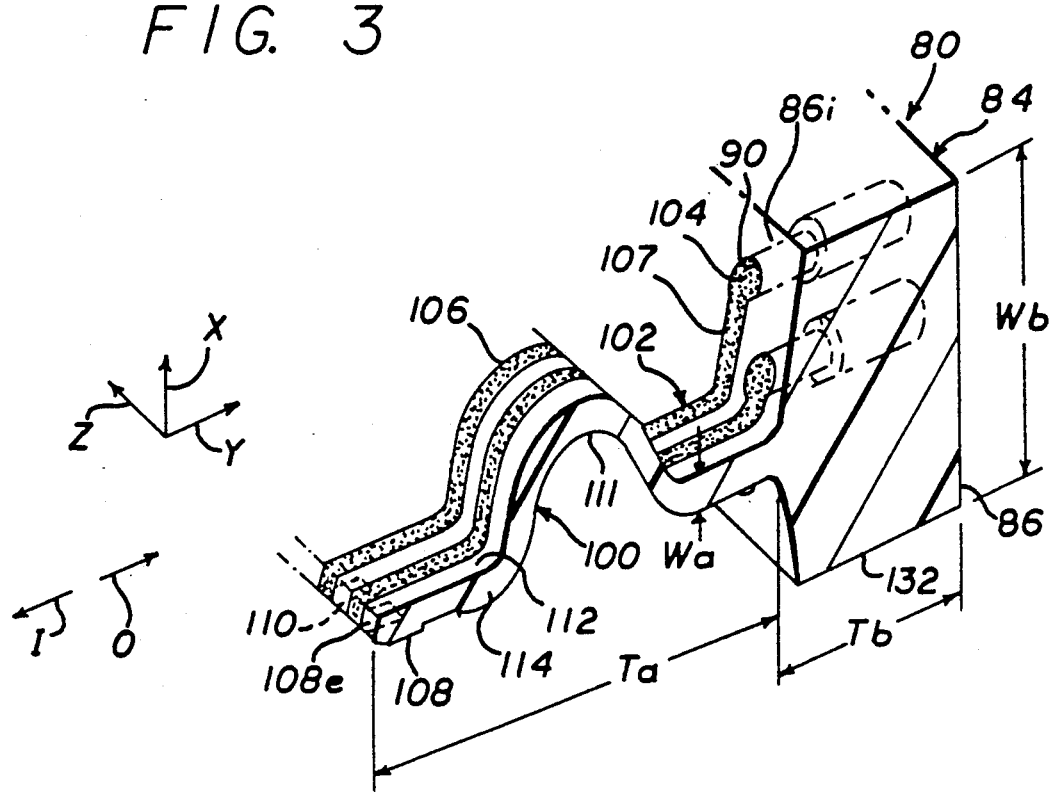
FIG. 3 is a partial isometric view of an insulator assembly of the connector assembly of FIG. 2.

FIG. 2 shows details of the present connector assembly 20. The connector assembly includes a pair of insulator assemblies 80, 82, that each comprises an insulator 84 of dielectric material. The insulator includes a body 86 having multiple holes 90 that each can receive a contact of a pin or socket type, a socket contact being shown at 92. The holes 90 are arranged in four rows 94-97, and an arm 100 extending from the body. As also shown in FIG. 3, the insulator assembly includes multiple electrically conductive plating regions such as 102. Each plating region includes a body hole plating part 104 that coats the walls of the body hole 90, and also includes a conductive trace 106 extending from the corresponding hole. The trace has an inner portion 107 that extends along an inner body surface 86i, but with most of the trace extending along the arm 100. Each arm has a free inner end portion or end 108 that is furthest from the body, and the trace forms a contact pad 110 on the inner end of the arm.

Figure 6:
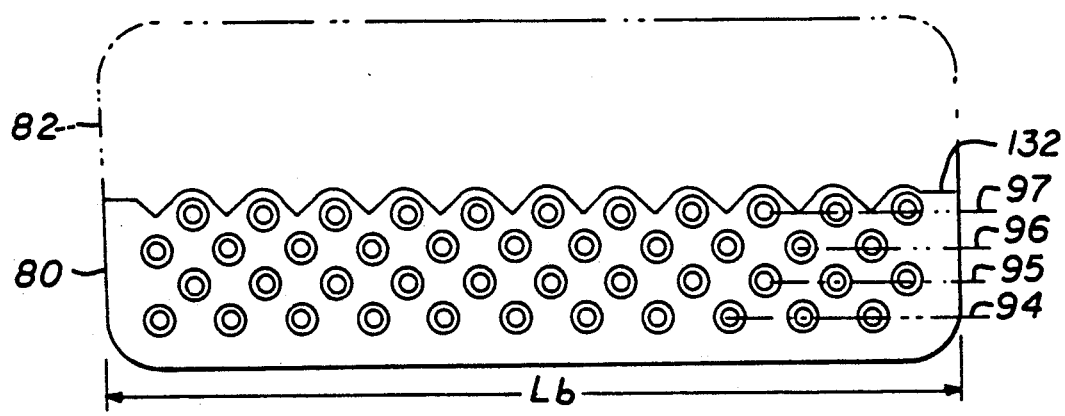
FIG. 6 is a plan view of an insulator assembly of FIG. 5.

The body has a width Wb, a thickness Tb and a length Lb (FIG. 6) extending respectively in a width dimension X (FIG. 3), a thickness dimension Y, and a lateral dimension Z. Inner and outer directions, indicated by arrows I and O are along the Y dimension. The average width Wa of the arm is much less than half the width Wb of the body. The longest dimension of the arm (which may be referred to as its length), as seen in the sectional view of FIG. 3, is a plurality of times greater than the width Wa of the arm. As a result, even though the insulator is formed of a rigid plastic material (that is, a plastic material that breaks under elongation or compression of more than 10%), the inner end 108 of the arm can be deflected a small amount in order to press against a circuit board. The arm has a looped portion 111 that provides additional resiliency.

The arm 100 has first and second opposite sides 112, 114. The conductive traces 106 on the first arm side extend around the extreme inner end 108e of the arm, to form the contact pads 110 on the second side of the arm. The traces 120 (FIG. 2) extending primarily along the second side 114 of the arm terminate a distance from the extreme outer end of the arm to form contact pads 122. The arm has a groove 124 between the two rows of contact pads 110, 122. The traces 106, 120 extend from holes that are in rows such as 94 and 96 (FIG. 5) whose axes 126, 128 lie on opposite sides of the arm 100.

Figure 5:
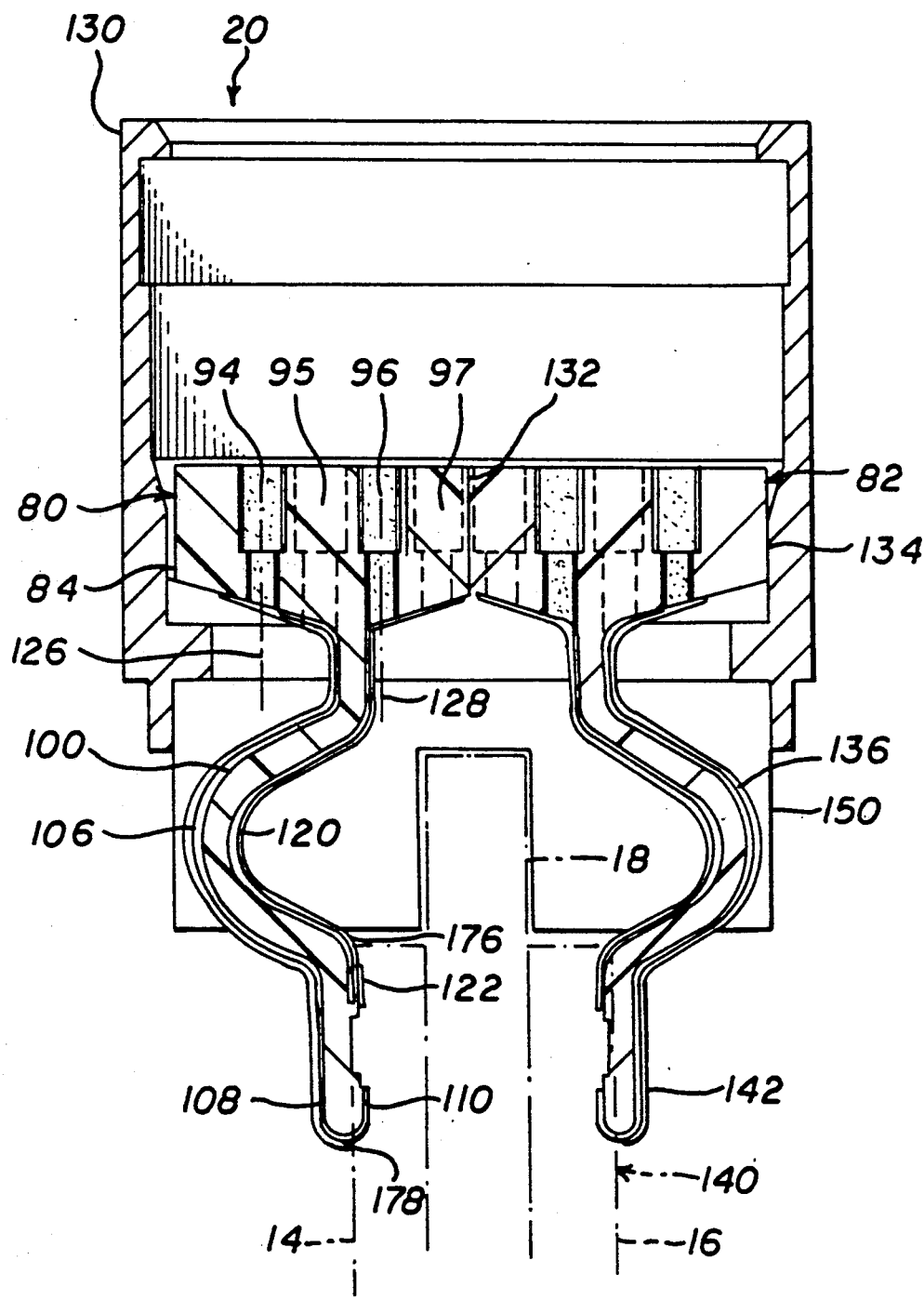
FIG. 5 is a view taken on the line 5—5 of FIG. 4, with the circuit board device shown in phantom lines.

As shown in FIG. 5, the two insulator assemblies 80, 82 are mounted in a connector shell 130 with adjacent sides 132 of the insulators 84, 134 lying substantially against each other, and with the arms 100, 136 of the two insulators lying opposite each other. The circuit board device 140, which comprises the heat sink plate 18 and the first and second circuit boards 14, 16, is then inserted between the inner ends 108, 142 of the arms. During such insertion, the inner ends of the arms are spread apart slightly, so the contact pads 110, 122 (FIG. 2) of the connector assembly can press against corresponding contact pad terminals 144, 146 on the circuit boards. The insulator assembly and circuit board device are held together by a mount 150 (FIG. 5) that attaches the shell 130 to the heat sink plate 18.

Each of the traces 106 (FIG. 3) of the insulator assembly preferably includes a copper underlayer and a solder overlayer. The traces 106 and the body hole plating parts 104 can be formed by well known methods, which may include plating the entire insulator and etching away areas between traces to leave the traces and hole platings, or by depositing each plating region 102 in areas between a mask that covers the entire insulator except for areas to form the traces and the walls of the holes. After the plating regions have been formed on the insulator, the socket contact 92 (FIG. 7) are installed.

Each socket contact includes a solid plug 150 and a socket spring 152 having a cylindrical inner end welded at 154 to the plug. The socket contact can be installed by merely inserting it into a wide outer hole portion 156 which closely receives the plug 150, until the plug abuts a shoulder 160 in the hole. The hole has a narrower inner portion 162 lying inward of the outer portion 156. After the contacts have been inserted, the insulator assembly is subjected to reflow soldering, as by placing it in a heated environment to melt the solder upper layer of the plating region 102. The contacts can be merely press fitted into the body holes although this reduces reliability. Then the insert assemblies are assembled to form the connector assembly. The connector assembly is installed on the circuit board device so the contact pads on the insulator assemblies press against the contact terminals on the circuit board device. The assembly is then subjected to reflow soldering. The contact terminals of the circuit board device may have a lower melting temperature than the solder layer on the insulator assembly, so reflow soldering to the contact terminals can be conducted at a lower temperature.

As a result of the above operations, each plating region on the insulator assembly is securely electrically connected to a socket contact and to a circuit board device terminal. The conductive path between the walls of the contact-holding hole and the contact pads at the ends of the arms are highly secure because they are integral and formed by deposition using known highly reliable methods. Simple socket contacts can be used, without the need for additional pins to attach to traces on a flexboard. It can be seen in FIG. 6, that the adjacent edges or sides such as 132 of each insulator undulates along the length Lb of the body, which prevents movement of one insulator relative to the other.

Figure 4:
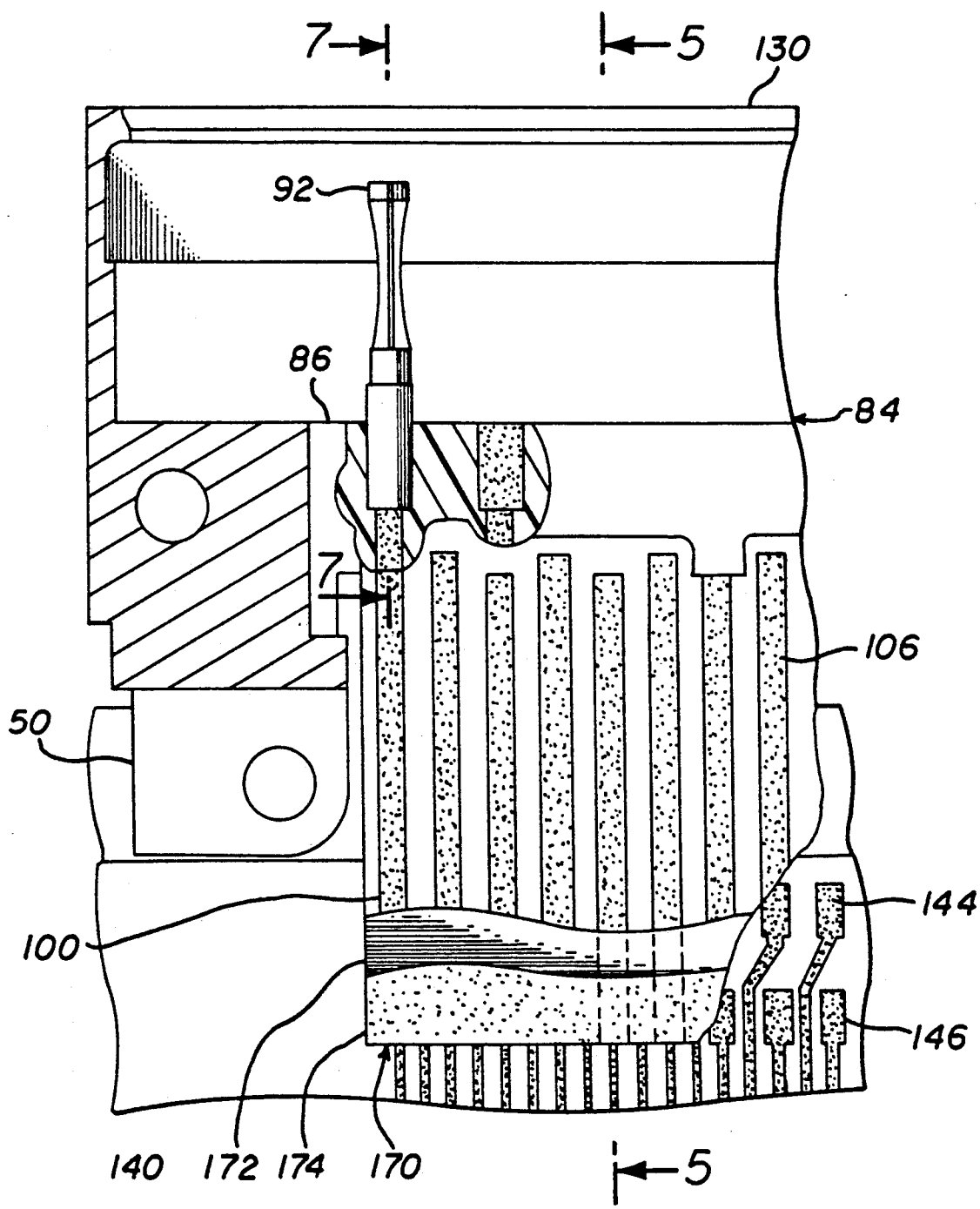
FIG. 4 is a partial side elevation view of the insulator assembly of FIG. 3, shown mounted in a connector assembly and mated to the circuit board device of FIG. 1.

As shown in FIGS. 4 and 5, applicant prefers to apply a coating 170 over most of the area of the sides 112, 114 of the arm after the conductive traces 106, 120 have been applied. The coating 170 includes a first or under layer 172 of a dielectric and an outer layer 174 of copper over the dielectric layer. The copper layer is grounded, or maintained at a constant potential, to minimize cross talk between adjacent traces. It can also control the characteristic impedance. The coating 170 ends at the locations 176, 178, to leave the portions of the traces that form contact pads 110, 122 exposed.

Applicant has designed a connector assembly of the construction illustrated, with the body having a width Wb (FIG. 3) of 0.25 inch, a thickness Tb of 0.134 inch, and a longitudinal dimension Lb of 1.196 inch, with adjacent hole rows spaced by 0.050 inch and with each trace having a width (along dimension L) of about 0.020 inch. The arm had a length Ta of 0.45 inch and a width Wa of 0.025 inch. The entire body was formed of 30% glass filled liquid crystal polymer. Two separate insulator assemblies are used for ease of construction, especially in the forming of the plating regions on the second side of each arm (which faces the other arm in the final assembly).

Thus, the invention provides an insulator assembly which can be used in a connector to hold contacts and connect them to a circuit board device or the like in a flexible mechanical connection that allows the circuit board device to shift relative to the contacts. The assembly includes an insulator having a body with contact-receiving holes and with a narrow and elongated arm projecting from the body. A plurality of conductive plating regions are formed on the insulator, with each region including a body hole plating part and a trace extending from the hole and along the arm to a contact pad at the inner end of the arm which is furthest from the body. By molding the body and arm integrally and forming the body hole plating part and the trace integrally, applicant is able to construct the insulator assembly with high reliability and at low cost. Two such insulator assemblies are mounted beside each other, so their arms can straddle a circuit board device or the like, with the contact pads engaging corresponding contact terminals on the circuit board device.

Although particular embodiments of the invention have been described and illustrated herein, it is recognized that modifications and variations may readily occur to those skilled in the art, and consequently it is intended that the claims be interpreted to cover such modifications and equivalents.

I claim:

1. A connector assembly comprising:
an insulator of dielectric material having a body with a plurality of through holes for receiving contacts, and having an elongated flexible arm extending from said body;
a plurality of electrically conductive plating regions on said insulator, each plating region including a body hole plating part covering the walls of each of said holes and also including a trace extending from each hole and along said arm and forming a contact pad;
said body and said arm being integrally molded, but with said arm being less than half the width of said body and having a length which is a plurality of times greater than its width, whereby said arm can flex to press said contact pads against pads of a circuit board or the like.

2. The connector assembly described in claim 1 wherein:
said arm has first and second opposite sides, said body has at least one row of contact-receiving holes on each side of said arm, and said traces lie on each of said arm sides.

3. The connector described in claim 2 wherein:
said arm has an end portion opposite said body, and said traces form first and second rows of contact pads at said end portion, with both of said rows lying on said second arm side; .

4. The connector described in claim 3 wherein:
said arm end portion has an extreme end;
said traces on said first arm side extend about said extreme end of said arm side and to pads of said first row.

5. The connector described in claim 4 including
a plurality of socket contacts, each including a solid plug with inner and outer ends and a slotted tubular socket spring mounted about said outer plug end, said plug having a cylindrical inner portion;
each of said holes in said body includes an outer hole portion which closely receives said plug inner portion, a narrower inner hole portion, and a shoulder between said hole portions which abuts said plug inner end;
said body hole plating part includes a continuous layer of solder covering said outer and inner hole portions and the trace connected therewith and soldered at said outer hole portion to said plug.

6. The connector assembly described in claim 1 including:
a first insulator assembly which includes said first insulator and said plating regions;
a second insulator assembly which is substantially identical to said first insulator assembly;
a shell, said first and second insulator assemblies being mounted in said shell with said bodies substantially abutting and with said arms spaced apart and both extending in a predetermined inward direction from the respective body;
a circuit board device which has opposite sides and at least one row of terminal pads on each side;
said insulator assemblies being arranged with the arms of said first and second assemblies being resiliently deflected apart and lying against said opposite sides of said circuit board device, and with said connector pads engaging said terminal pads.

7. A connector assembly comprising:
a connector insulator of substantially rigid dielectric material, including a body having width, length, and thickness dimensions and having a plurality of contact-receiving through holes extending in inner and outer directions along said thickness dimension, said insulator also including an arm having less than half the width of said body and being a plurality times longer along said inner and outer directions than its width so the arm can flex slightly along said width dimension;
said arm has an outer end merging with said body and has an opposite free inner end, and has first and second opposite arm sides, and said holes in said body are arranged in at least first and second rows with each row extending along the length dimension of said insulator, and with the inner ends of the first row of holes lying beyond said first arm side and with the inner ends of said second row of holes lying beyond said second arm side;
an electrically conductive plating lying on said insulator and divided into a plurality of separate regions, each plating region plating the walls of a hole and forming a trace that is integral with the hole plating and that extends along an adjacent one of said arm sides along most of the arm length in said inner and outer directions, with each trace ending in a contact pad.

8. The connector assembly described in claim 7 wherein:
said traces include first and second traces lying primarily on said first and second arm sides, respectively;

each first trace extends around the extreme inner arm end, with the contact pad at the end of the first trace lying on said second arm side;

each second trace has a contact pad lying on said second arm side.

9. The connector assembly described in claim 7 including:
- a circuit board device that has opposite device sides and that has at least one row of terminal pads on each of said device sides;
- a first insulator assembly which includes said first insulator and said plating;
- a second insulator assembly which is substantially identical to said first insulator assembly, and includes a second insulator with a second arm and a second plating forming hole platings and traces extending along said second arm and ending in contact pads;
- a shell holding said insulator assemblies adjacent to each other with said width, length, and thickness dimensions of said bodies of said insulators being parallel, and with the arms of said insulators lying opposite each other and against said circuit board device opposite sides with said contact pads engaging said terminal pads.

10. In an assembly which includes a circuit board device having opposite sides and at least one row of terminal pads on a first board side, and a connector assembly which includes a body having a plurality of rows of holes that each holds a contact and at least one flexible arm with inner and outer end and which has a plurality of conductive traces thereon that each have an outer trace end electrically coupled to a contact in a body hole and an opposite inner trace end forming a contact pad, with the inner arm end lying adjacent to said first board device side and the contact pads engaged with the board device terminal pads, to allow the contacts and body to move slightly relative to the board while maintaining connections through the contact pads and terminal pads, the improvement wherein:
- said body and arm are integrally molded portions of an insulator, and including a plurality of electrically conductive plating regions on said insulator, each region including one of said traces and an integral hole plating that plates one of said holes.

11. The improvement described in claim 10 wherein: each of said holes in said body includes a wider outer hole portion and a narrower inner hole portion which merges with one of said traces, and each of said contacts is closely received in only said outer hole portion;

each of said conductive plating regions has a solder layer part with the portion thereof in each of said outer hole portions being soldered to the contact lying in the hole.

12. The improvement described in claim 10 wherein: said circuit board device has at least one row of terminal pads on each of its sides;

said connector assembly includes two of said insulators, each having substantially identical arms and plating regions, said connector assembly also including a shell that holds said insulators together with said arm inner ends bearing against said opposite sides of said board device.

13. The improvement described in claim 12 wherein: each arm of an insulator has first and second opposite sides and the body of each insulator has at least one row of holes on each side of the corresponding arm, and the traces on each insulator lie on each of the sides of the corresponding arm.

14. The improvement described in claim 13 wherein: said inner arm end has two rows of contact pads on said second arm side, and the traces on said first arm side extend about the extreme inner end of the arm.

* * * * *